(12) United States Patent
Rogers et al.

(10) Patent No.: US 8,471,750 B2
(45) Date of Patent: Jun. 25, 2013

(54) SYSTEM AND METHOD FOR COMPRESSIVE SENSING

(75) Inventors: Daniel J. Rogers, Baltimore, MD (US); Sang H. Chin, Bethesda, MD (US); Radmil Elkis, Ellicott City, MD (US)

(73) Assignee: The Johns Hopkins University, Baltimore, MD (US)

( * ) Notice: Subject to any disclaimer, the term of this patent is extended or adjusted under 35 U.S.C. 154(b) by 63 days.

(21) Appl. No.: 13/230,314

(22) Filed: Sep. 27, 2011

(65) Prior Publication Data

US 2012/0075134 A1  Mar. 29, 2012

Related U.S. Application Data

(60) Provisional application No. 61/387,692, filed on Sep. 29, 2010.

(51) Int. Cl.
*H03M 1/12* (2006.01)
(52) U.S. Cl.
USPC .......................................... 341/155; 702/189
(58) Field of Classification Search
USPC ................... 341/155; 702/189, 196, 66, 190, 702/197
See application file for complete search history.

(56) References Cited

U.S. PATENT DOCUMENTS

| | | | |
|---|---|---|---|
| 4,059,729 A | 11/1977 | Eddy et al. | |
| 5,701,302 A | 12/1997 | Geiger | |
| 7,057,635 B1 | 6/2006 | Naden | |
| 7,356,036 B2 | 4/2008 | Van Der Valk et al. | |
| 7,454,634 B1 | 11/2008 | Donovan et al. | |
| 7,639,597 B2 | 12/2009 | Shattil | |
| 7,679,333 B2 | 3/2010 | Goto | |
| 7,834,795 B1 * | 11/2010 | Dudgeon et al. | 341/155 |
| 7,859,442 B2 | 12/2010 | Daniels et al. | |
| 7,881,684 B2 | 2/2011 | Nakagawa et al. | |
| 2007/0100921 A1 | 5/2007 | Barnett et al. | |
| 2009/0106339 A1 | 4/2009 | Vasyltsov et al. | |
| 2009/0153388 A1 * | 6/2009 | Waltari et al. | 341/160 |

FOREIGN PATENT DOCUMENTS

EP  468680  1/1992

* cited by examiner

*Primary Examiner* — Joseph Lauture
(74) *Attorney, Agent, or Firm* — Aisha Ahmad (57) ABSTRACT

The present invention provides a system for use with an input signal and a clock signal. The system includes a physical random interval generator, a sampling analog-to-digital converter (ADC), a timing signal generator and a reconstructor. The physical random interval generator can generate a random output signal. The ADC can output a sampled output signal based on the input signal and the random output signal. The timing signal generator can output a timing signal based on the clock signal and the random output signal. The reconstructor can reconstruct an information signal based on the sampled output signal and the timing signal.

18 Claims, 8 Drawing Sheets

SYSTEM AND METHOD FOR COMPRESSIVE SENSING

CROSS REFERENCE TO RELATED APPLICATIONS

The present application claims priority from U.S. Provisional Application No. 61/387,692 filed Sep. 29, 2010, the entire disclosure of which is incorporated herein by reference.

BACKGROUND

Reception and reconstruction of analog signals are performed in a wide variety of applications, including wireless communication systems, spectrum management applications, radar systems, medical imaging systems and many others. In many of these applications, an information-carrying analog signal is sampled, i.e., converted into digital samples. The information is then reconstructed by processing the digital samples.

The minimum sampling rate needed for perfect reconstruction of an arbitrary sampling method is known. Further, various methods for signal sampling and reconstruction are known in the art. Some sampling and reconstruction methods refer to bandpass or band-limited signals, and in particular to multi-band signals, i.e., signals that are confined to a finite set of spectral bands. Additionally known are methods for periodic non-uniform sampling of multi-band signals and methods for sampling and reconstruction of multi-band signals.

Various applications, particularly in the field of secure communications, require the production of truly random numbers at a high bit-rate. Most current random number generators (RNGs) typically employ complicated, yet ultimately deterministic, calculations, generating numbers that are, at best, pseudo-random. Other methods employ the inherent, and essential, randomness of quantum processes, since, in accordance with the laws of physics, there is no way, even in theory, to find a pattern within random numbers generated from quantum measurement. Such methods include radioactive decay (see, for example, U.S. Pat. No. 6,445,217, to Figotin, et al., issued Jun. 1, 2004) or outputs of a beam splitter to establish random numbers from the path of a photon (U.S. Pat. No. 6,309,139, to Dultz et al., issued Aug. 19, 2003). A further method uses thermodynamic processes such as diode current fluctuations or Johnson noise measured on the voltage across a resistor (see, for example, U.S. Pat. No. 6,271,263, to Nagai, issued May 27, 2003).

Compressive sensing is a promising new field that has unlocked novel devices such as the single pixel camera. Many demonstrations of compressive sensing involve a high speed clock somewhere in the signal chain, diminishing the advantages of slow and brief sampling that compressive sensing offers.

Compressive sensing is a technique for finding sparse solutions to underdetermined linear systems. An underdetermined system of linear equations has more unknowns than equations and generally has an infinite number of solutions. However, if there is a unique sparse solution to the underdetermined system, then the compressed Sensing framework allows the recovery of that solution. In electrical engineering, particularly in signal processing, compressed sensing is the process of acquiring and reconstructing a signal that is supposed to be sparse or compressible.

Sampling is the process of converting a signal (for example, a function of continuous time or space) into a numeric sequence (a function of discrete time or space). The Nyquist theorem states:

If a function x(t) contains no frequencies higher than B hertz, it is completely determined by giving its ordinates at a series of points spaced 1/(2B) seconds apart.

In essence, the theorem shows that a band-limited analog signal that has been sampled can be perfectly reconstructed from an infinite sequence of samples if the sampling rate exceeds 2B samples per second, where B is the highest frequency in the original signal. If a signal contains a component at exactly B hertz, then samples spaced at exactly 1/(2B) seconds do not completely determine the signal By extending the all-or-nothing conditional of the Nyquist theorem, compressive sensing promises to open up entire new realms of sensing techniques. In the areas of communications and RF signal detection, compressive sensing can potentially enable the capture and reconstruction of signals over large bandwidth with small, low-power hardware and extremely small numbers of samples.

Initial demonstrations of compressive RF sampling consisted of capturing high-bandwidth sparse signals with fast digitizers, which handily satisfy the Nyquist condition, followed by post-selecting a random subset of samples. Hypothetically, were one to only have access to that limited, random subset, one could successfully reconstruct the signal with high probability. Of course, the initial investment in performing high-speed digital sampling of the signal negates the need for the compressive alternative.

A second generation of compressive RF sensors developed around the concept of random demodulation in which the signal of interest is mixed with a pseudo-random phase sequence and sampled with a lower-speed ADC. While this approach provides power savings with its lack of a high-speed ADC, it still requires high-speed digital hardware to generate the pseudo-random sequences. In this way, it does not fully realize the advantages of compressive sensing for RF signals.

What is needed are improved systems and methods for performing compressive sensing.

BRIEF SUMMARY

The present invention provides a compressive sensing technique for performing reconstruction of signals using a low frequency clock signal as compared to the frequency components of the signals being reconstructed.

In accordance with aspects of the present invention a system is provided for use with an input signal and a clock signal. The system includes a physical random interval generator, a sampling ADC, a timing signal generator and a reconstructor. The physical random interval generator can generate a random output signal. The ADC can output a sampled output signal based on the input signal and the random output signal. The timing signal generator can output a timing signal based on the clock signal and the random output signal. The reconstructor can reconstruct an information signal based on the sampled output signal and the timing signal.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with aspects of the present invention, a compressive sensor system does not require a high-speed clock in the signal chain. By employing a physical source of entropy and applying a sub-clock resolution timing scheme to record randomly-timed digital samples, a compressive sensor is demonstrated enabling reduced signal measurement energy requirements when extrapolated to higher bandwidths.

Most conventional sources of entropy are in fact 'pseudo-random.' That is, in lieu of generating true physically random numbers, these sources use computational complexity to generate numerical sequences that approximate random ones. These techniques were developed primarily for Monte Carlo simulations or cryptographic applications, where high-speed digital hardware is cheap and ubiquitous. The demands of compressive sensing are entirely antithetical. Compressive sensing has unique advantages where the hardware itself must be compact and low-power. Thus, computational methods for generating entropy are not ideal. Instead, aspects of the present invention make use of a significant body of existing research on physical sources of entropy, non-limiting examples of which include thermal sources based on noisy resistors, chaotic sources based on optical intensity noise, and quantum random number generators based on the single-photon statistics of severely attenuated lasers.

Most of these sources were originally developed for advanced cryptographic applications where very high-quality random numbers are vital. However, the demands on entropy for compressive sensing are much more relaxed; the random sampling matrix must simply satisfy restricted isometry rather than pass stringent, often poorly defined, tests for cryptographic randomness. Thus, instantiation of any physical source of entropy for compressive sensing in accordance with the present invention can be greatly simplified.

An example embodiment uses the physical hardware of a quantum random number generator. This setup operates by measuring the time between single-photon emissions of a strongly attenuated diode laser using a Geiger-mode avalanche photodiode. The Poisson distribution of photon number for coherent light sources gives rise to an exponential distribution, $p(x)=\lambda e^{-\lambda x}$ for $x \geq 0$, with rate parameter $\lambda$, of photon arrival time intervals when the source is strongly attenuated.

For cryptographic applications, where regularly timed and uniformly distributed random numbers are vital, the intervals between photon arrival events must be measured using a high-speed digital counter. Those intervals must then be whitened and buffered to generate cryptographic random sequences. Since interest is in random intervals rather than regularly timed random numbers, the present invention is able to eliminate the timing and buffering stages.

Furthermore, even exponentially distributed sampling time intervals still results in a random sampling matrix that satisfies the Restricted Isometry Property (RIP) required of the compressive sensing sampling matrix, eliminating the need for any pulse-shaping or digital whitening. Note that any physical source of entropy may be used, non-limiting examples of which include a chaotic laser or, most promisingly, a noisy resistor and associated operational amplifier for an all-CMOS system.

One significant challenge in constructing a compressive sensor in accordance with the present invention is selecting a proper ADC architecture to accept randomly timed trigger pulses. Most ADC architectures are designed around specific timing requirements; sigma-delta ADCs, for example, generate pulse sequences at various densities in order to encode analog voltages, a process that relies entirely on a regular clock reference. The only architecture that can support direct, un-timed conversion of analog signals into the digital domain is the flash architecture. Flash ADCs are essentially banks of comparators and a resistor ladder. The comparators output a parallel 'thermometer' code of $2^N$ bits, where N is the number of bits of the ADC. This thermometer code is then converted via simple logic to a denser format such as binary-coded decimal or Gray codes and buffered using a latch that normally accepts the clock input.

Flash ADCs are typically not used except in the highest-speed, lowest-resolution applications, since they are the most power-inefficient and complex architecture available; each additional bit of resolution requires a doubling of the number of comparators, leading to significant problems with propagation delay and power consumption within the device for resolutions above 6 or 7 bits.

Additionally, flash ADCs often include one or more sample-and-hold amplifiers in front of the resistor ladder. These circuits maintain the same voltage at each node of the ladder over a time period long enough to allow the signal to propagate to the last comparator. This ensures that all comparators operate on the same input signal uncorrupted by propagation delays across the comparator chain. The time constant of the sample and hold circuit is entirely dependent on assumptions about the clock frequency; at higher bandwidths, when there is no deterministic clock frequency, the sample-and-hold circuitry can wreak havoc on the measurement. Thus, for this architecture to be scalable to higher bandwidths, it is important that a flash ADC is selected that does not have sample-and-hold included. Of course, this typically limits the ADCs to 6 bits of resolution or less for off-the-shelf components, since architectures with more than 6 bits that lack sample-and-hold circuitry often suffer from insurmountable propagation delays.

A challenge in implementing a compressive sensor with a physically random clock in accordance with aspects of the present invention is estimating the time intervals between sampling pulses. Typically, one would achieve this using a high-speed digital counter with a time resolution a number of times finer than the fastest frequency component one would want to sense. However, it is goal of the present invention to avoid high-speed clocks entirely in order to reap the maximum benefit from compressive sensing techniques, and using a digital counter with such fine time resolution would employ an oscillator that could easily satisfy the Nyquist condition were it used to clock a high-speed ADC. Instead, the present invention employs a low-speed clock, a counter-accumulator, and a linear ramp generating circuit to provide time interval estimates. In addition to a flash ADC to sample the signal of interest, the present invention employs a second flash ADC to sample the ramp voltage and capture the counter-accumulator value at the same time as it samples the signal of interest. By comparing the successive sample values on the timing channel, one can use the ramp properties and the counter value to estimate the elapsed time between successive samples.

The obvious limitation in timing resolution of this scheme lies in the limited resolution of the ADC, combined with the ramp rate, which itself must be tailored to the statistics of the random interval generator.

Example systems and methods of compressive sensing in accordance with aspects of the present invention will now be described with reference to FIGS. 1-8.

Figure 1:
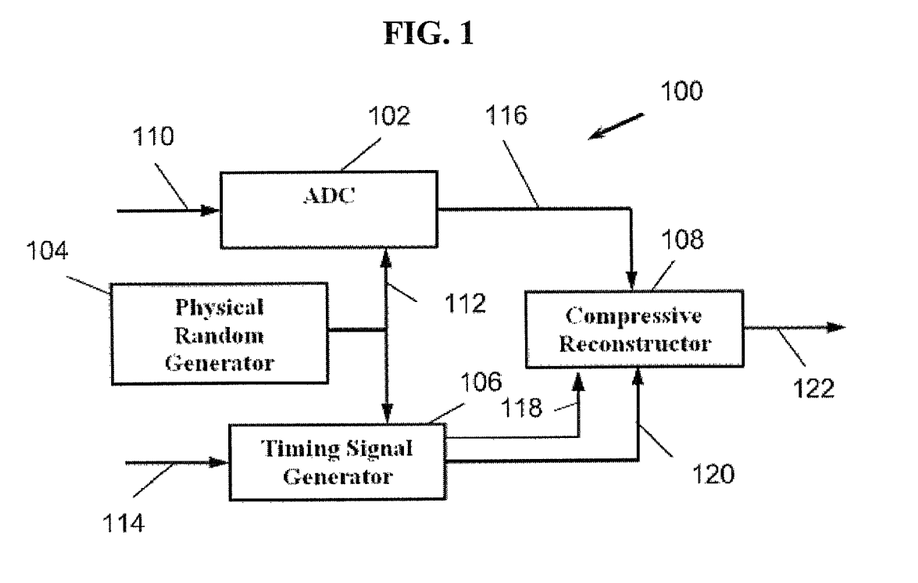
FIG. 1 illustrates an example compressive sensor system, in accordance with an aspect of the present invention.

FIG. 1 is an illustration for an example compressive sensor 100, in accordance with an aspect of the present invention.

Compressive sensor 100 includes a sampling ADC 102, a physical random interval generator 104, a timing signal generator 106, and a compressive reconstructor 108. Each of the elements of compressive sensor 100 are illustrated as individual devices, however, in some embodiments of the present invention, at least two of sampling ADC 102, physical random interval generator 104, timing signal generator 106, and compressive reconstructor 108 may be combined as a unitary device. Further, in some embodiments, at least one of sampling ADC 102, physical random interval generator 104, timing signal generator 106, and compressive reconstructor 108 may be contained as a utility, program, or subprogram, in any desired tangible computer readable storage medium. In addition, the operations may be embodied by computer programs, which can exist in a variety of forms both active and inactive. For example, they may exist as software program(s) comprised of program instructions in source code, object code, executable code or other formats. Any of the above may be embodied on a tangible computer readable storage medium, which include storage devices. Exemplary tangible computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above. When information is transferred or provided over a network or another communications connection (either hardwired, wireless, or a combination of hardwired and wireless) to a computer, the computer properly views the connection as a tangible computer-readable storage medium. Thus, any such connection is properly termed a tangible computer-readable storage medium. Combinations of the above should also be included within the scope of computer-readable storage media.

Physical random interval generator 104 generates a random signal 112.

Sampling ADC 102 is arranged to output a digital signal 116 based on an input signal 110 and random signal 112. In an example embodiment, sampling ADC 102 is arranged to receive input signal 110 and random signal 112. Alternatively, intermediate circuitry may be included to modify input signal 110 and/or random signal 112 somewhat prior to sampling ADC 102. Non-limiting examples of intermediate circuitry include matching networks, amplifiers, filters, resistors, etc.

Timing signal generator 106 is arranged to output a random timing signal 118 and a counter signal 420. Counter signal 420 is based on a clock signal 114, whereas random timing signal 418 is based on clock signal 114 and random signal 112. In an example embodiment, timing signal generator 106 is arranged to receive clock signal 114 and random signal 112. Alternatively, intermediate circuitry may be included to modify clock signal 114 and/or random signal 112 somewhat prior to timing signal generator 106.

Compressive reconstructor 108 is arranged to output a reconstructed signal 122 based on digital signal 116, random timing signal 118 and counter signal 120. In an example embodiment, compressive reconstructor 108 is arranged to receive digital signal 116, random timing signal 118 and counter signal 120. Alternatively, intermediate circuitry may be included to modify digital signal 116, random timing signal 118 and/or counter signal 120 somewhat prior to compressive reconstructor 108.

Compressive sensor 100, as a whole, receives and processes a received input signal for reconstruction of an uncompressed signal.

In operation, sampling ADC 102 receives compressed input signal 110 and randomly converts the analog signal to a digital or discrete signal. Furthermore, sampling ADC 102 performs the random conversion based upon a random signal received from physical random interval generator 104.

Timing signal generator 106 receives clock signal 114 with a frequency of operation lower than the frequency components associated with input signal 110. Compressive reconstructor 108 receives the randomly converted signal from sampling ADC 102 via digital signal 116, receives a digital ramp signal randomly sampled from timing signal generator 106 via random timing signal 418 and receives an incrementing count signal from timing signal generator 106 via counter signal 420 to perform reconstruction of the signal received via digital signal 116 for delivery via reconstructed signal 122.

Compressive sensor 100 will be now described in further detail with reference to FIG. 2.

Figure 2:
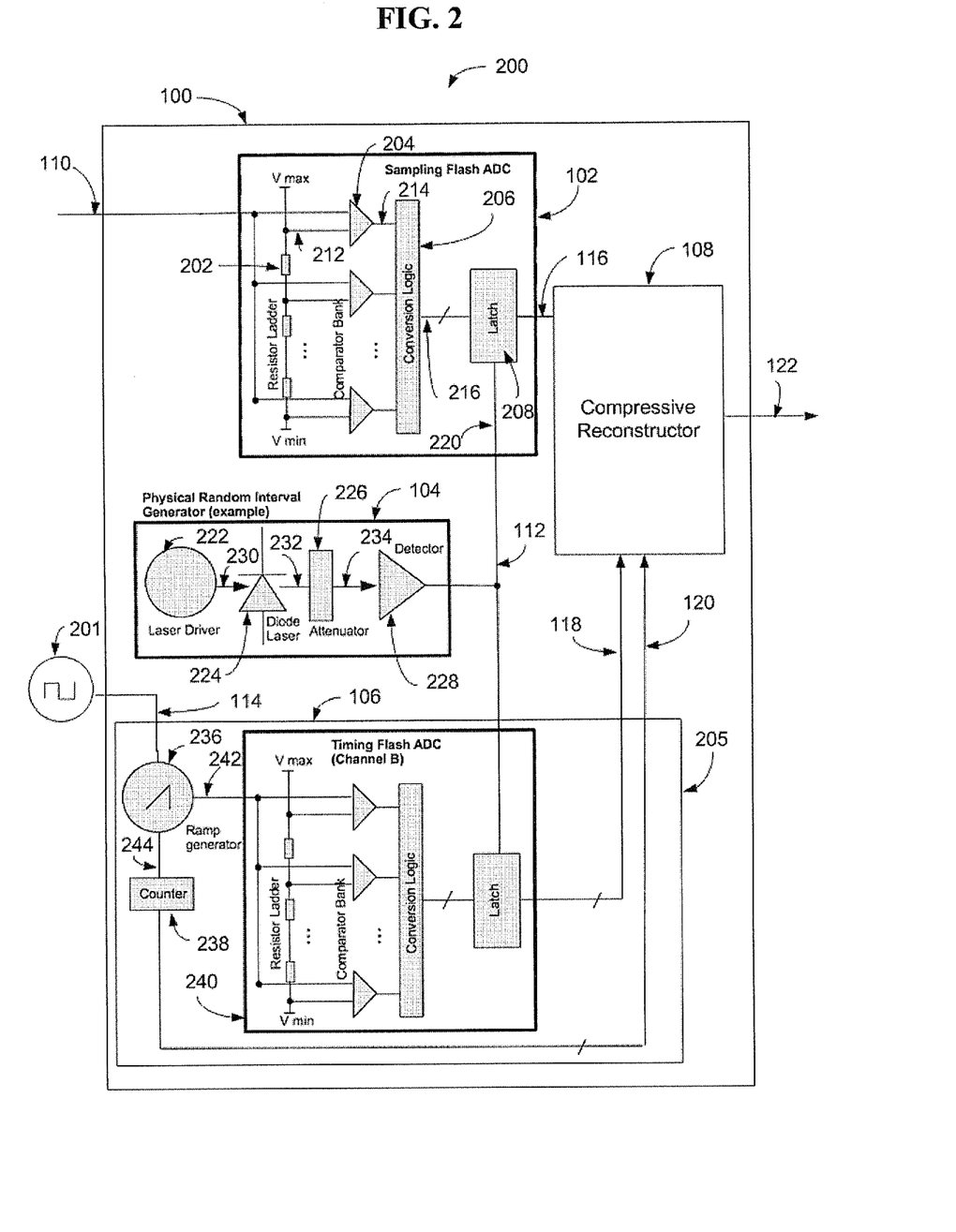
FIG. 2 illustrates a more detailed view of the compressive sensor system of FIG. 1, in accordance with an aspect of the present invention.

FIG. 2 is an illustration for an example compressive sensor system 200, in accordance with an aspect of the present invention.

Compressive sensor system 200 includes compressive sensor 100 and a clock generator 201. Each of the elements of compressive sensor system 200 are illustrated as individual devices, however, in some embodiments of the present invention, compressive sensor 100 and clock generator 201 may be combined as a unitary device.

Clock generator 201 generates clock signal 114. Sampling ADC 102 includes a plurality of resistors with a sampling denoted as a resistor 202, a plurality of comparators with a sampling denoted as a comparator 204, a conversion logic portion 206 and a latch 208.

Resistor 202 provides voltage drop. Comparator 204 compares the voltage potential of an input signal to a known voltage potential. Conversion logic portion 206 receives of information for determining a digital representation associated with a received analog signal. Latch 208 preserves an input based upon a latching input signal. As a non-limiting example, latch 208 may retain on its output signal a rendition of its input signal at the rising edge of a latch signal.

Sampling ADC 102 additionally includes banks of comparators and a resistor ladder. The comparators output a parallel 'thermometer' code of $2^N$ bits, where N is the number of bits of resolution of the sampling ADC 102. This thermometer code is then converted via simple logic to a denser format such as binary-coded decimal or Gray codes and buffered using a latch that normally accepts the clock input. Additional bits of resolution for sampling ADC 102 require a doubling of the number of comparators.

Additionally, for some sampling ADCs, sample-and-hold amplifiers may be included prior to the resistor ladder. The sample-and-hold amplifiers maintain the same voltage at the nodes of the resistor ladder over a time period sufficient enough to allow the signal to propagate to the last comparator. The configuration with sample-and-hold amplifiers enables the comparators to operate on the same input signal uncorrupted by propagation delays across the comparator chain.

The time constant of the sample and hold circuit is entirely dependent on assumptions about the clock frequency; at higher bandwidths, when there is no deterministic clock frequency, the sample-and-hold circuitry can pose problems for realizing an accurate measurement.

In order to support scalability to higher bandwidths, a sampling ADC is configured such that it does not include a sample-and-hold. For conventional technology, using a sampling ADC without a sample-and-hold typically limits the sampling ADC to 6 bits of resolution or less for off-the-shelf components, since architectures with more than 6 bits that lack sample-and-hold circuitry often suffer from propagation delays which may result in unwanted results.

In operation, input signal 110 is received by comparator 204. Comparator compares the received signal with a known voltage supplied via a signal 212 received from resistor 202. If the voltage of the received signal is greater than the voltage received by signal 212, then comparator transmits a logic 1 to its output. If the voltage of the received signal is less than the voltage received by signal 212, then comparator transmits a logic 0 to its output. Conversion logic portion 206 receives the output information provided by the multiplicity of comparators (e.g. comparator 204) and based upon the various inputs generates a digital output representing the received analog signal. The digital output representing the received analog signal is received by latch 208 via a signal 216. Latch 208 presents the information received by its inputs to its output via digital signal 116 upon receiving a signal to latch via random signal 112. Latch 208 maintains information at its output until instructed to transition to a new output value via random signal 112.

Physical random interval generator 104 includes a laser driver 222, a diode laser 224, an attenuator 226 and a detector 228. Non-limiting examples for other configurations for physical random interval generator 104 include a chaotic laser and a noisy resistor with an associated operational amplifier and comparator. Furthermore, any known physical source of entropy may be used for physical random interval generator 104.

Laser driver 222 provides electrical power. Diode laser 224 generates laser beam. Attenuator 226 attenuates the laser beam created by diode laser 224. Detector 228 detects and communicates receipt of a photon. As a non-limiting example, detector 228 may be a Geiger-mode avalanche photodiode.

Diode laser 224 receives a power supply signal 230 from laser driver 222. Attenuator 226 receives a signal 232 from diode laser 224. Detector 228 receives a signal 234 from attenuator 226 and provides a random signal to random signal 112.

Physical random interval generator 104 measures the time between single-photon emissions of diode laser 224 attenuated by attenuator 226 and using detector 228 for detecting single-photon emissions.

The Poisson distribution of photon number for coherent light sources gives rise to an exponential distribution, $p(x)=\lambda \exp(-\lambda x)$ for $x \geqq 0$, with rate parameter $\lambda$, of photon arrival time intervals when source of emission from diode laser 224 is attenuated by attenuator 226. Furthermore, exponentially distributed sampling time intervals may result in a random sampling matrix satisfying the Restricted Isometry Property (RIP) needed for the compressive sensing sampling matrix, enabling configuration without the need for pulse-shaping or digital whitening. In linear algebra, the RIP characterizes matrices that are nearly orthonormal, at least when operating on sparse vectors.

Timing signal generator 106 includes a ramp generator 236, a counter 238 and a sampling ADC 240.

Timing signal generator 106 generates a timing signal and a random output signal. Ramp generator 236 receives a clock signal and generates a ramp signal. Counter 238 increments a count value when signaled and maintains and provides count value.

A sampling ADC 205 receives an analog ramp signal and converts analog ramp signal to a digital or discrete ramp signal. Sampling ADC 205 has a similar configuration to sampling ADC 102 described previously.

Ramp generator receives clock signal 114 from clock generator 201. Sampling ADC 205 is arranged to receive a signal from ramp generator 236 via a signal 242. Counter 238 is arranged to receive a signal from ramp generator 236 via a signal 244.

Compressive reconstructor 108 is arranged to receive a signal from latch 208 via digital signal 116, to receive a signal from sampling ADC 240 via random timing signal 118 and to receive a signal from counter 238 via counter signal 120.

Compressive reconstructor 108 provides reconstructed signal 122 to sources located external to compressive sensor system 200.

In operation, sampling ADC 102 receives compressed input signal 110 and randomly converts the analog signal to a digital or discrete signal. Furthermore, sampling ADC 102 performs the random conversion based upon a random signal received from detector 228. Timing signal generator 106 receives a clock signal from clock generator 201 via clock signal 114 with a frequency of operation lower than the frequency components associated with the received analog signal. Compressive reconstructor 108 receives the randomly converted signal from latch 208 via digital signal 116, receives a digital ramp signal randomly sampled from timing signal generator 106 via random timing signal 118 and receives an incrementing count signal from counter 238 of timing signal generator 106 via counter signal 120 to perform reconstruction of the signal received via digital signal 116 for delivery via reconstructed signal 122.

FIG. 2 is an illustration for an example compressive sensor system where an analog information signal is digitized and sampled based upon a random signal, an analog ramp signal is digitized and sampled based upon a random signal and the ramp signal increments a counter. Furthermore, digitized and randomly sampled received signal, digitized and randomly sampled ramp signal and counter value are used for performing compressive reconstruction. Furthermore, the frequency for the signal used for random sampling of received signal and ramp signal has a lower frequency component than the frequency components for the received signal.

Figure 3:
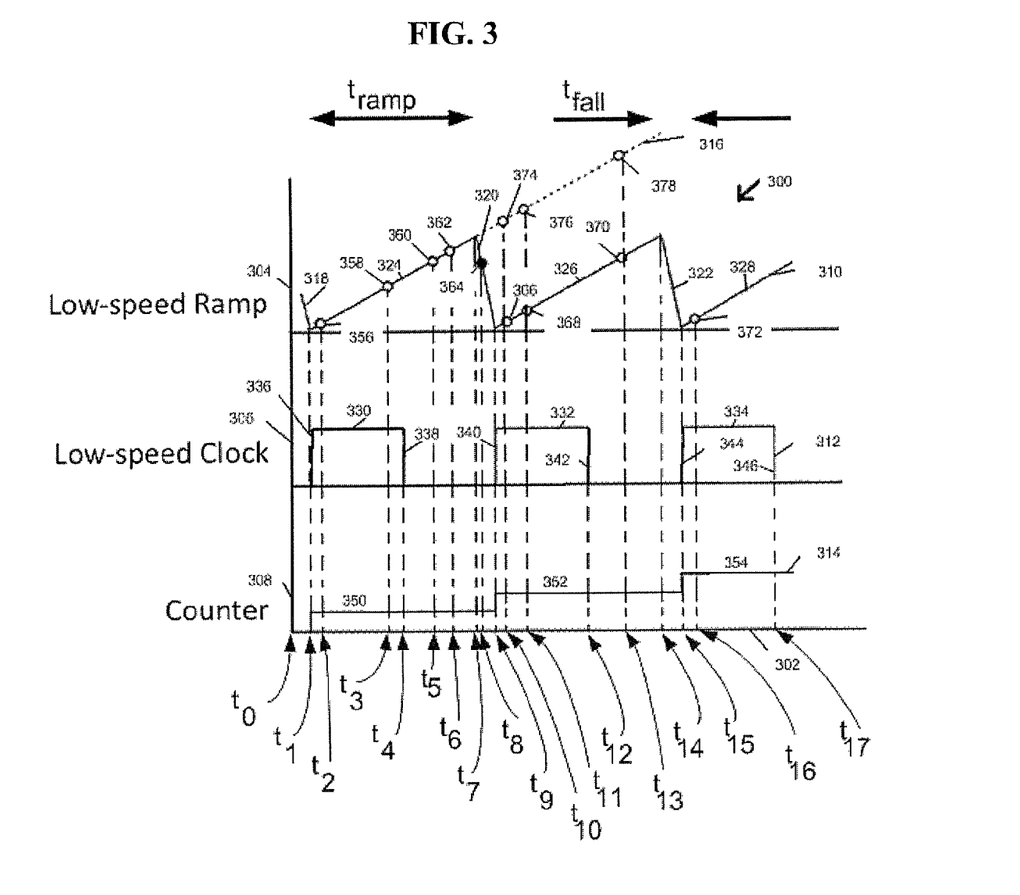
FIG. 3 is a graph of example waveforms for the operation of the compressive sensor system of FIG. 2, in accordance with an aspect of the present invention.

FIG. 3 is a graph 300 of example waveforms for the operation of compressive sensor system 200 described with reference to FIG. 2, in accordance with an aspect of the present invention.

Graph 300 includes an x-axis 302 with units of microseconds, a first y-axis 304 with units of Volts, a second y-axis 306 with units of Volts and a third y-axis 308 with units of Volts.

A waveform 310 corresponds to an example of ramping signal 242 as generated by ramp generator 236. A waveform 312 corresponds to example clock signal 114 as generated by clock generator 201. A waveform 314 corresponds to counter signal 120 as generated by counter 238. A dotted-line 316 corresponds to a linear function used to map sampled voltage values, as will be discussed below.

In this example, waveform 310 is a saw-tooth shape, having falling edges 318, 320 and 322 and having rising edges 324, 326 and 328. Falling edge 318 falls from time $t_0$ to time $t_1$. Rising edge 324 rises from time $t_1$ to time $t_7$. Falling edge 320 falls from time $t_7$ to time $t_9$. Rising edge 326 rises from time $t_9$ to time $t_{14}$. Falling edge 322 falls from time $t_{14}$ to time $t_{15}$. Rising edge 328 rises from time $t_{15}$.

In this example, waveform 312 is a square pulse shape with three pulses 330, 332 and 334. Pulse 330 has a rising edge 336 at time $t_1$ and a falling edge 338 at time $t_4$. Pulse 332 has a rising edge 340 at time $t_9$ and a falling edge 342 at time $t_{12}$. Pulse 334 has a rising edge 344 at time $t_{15}$ and a falling edge 346 at time $t_{17}$.

In this example, waveform 314 is stepped-shaped with three steps 350, 352 and 354. Step 350 rises at time $t_1$. Step 352 rises at time $t_9$. Step 354 rises at time $t_{15}$.

A plurality of voltages are sampled from waveform 310 at random intervals. These samples include: a voltage value 356 at time $t_2$; a voltage value 358 at time $t_3$; a voltage value 360 at time $t_5$; a voltage value 362 at time $t_6$; a voltage value 364 at time $t_8$; a voltage value 366 at time $t_{10}$; a voltage value 368 at time $t_{11}$; a voltage value 370 at time $t_{13}$; and a voltage value 372 at time $t_{16}$. These samples correspond to samples of random timing signal 118 as generated by sampling ADC 205. Dotted-line 316 corresponds to an example linearly increasing function for mapped sampled values, as will be described in greater detail below.

Dotted-line 316 is a continuation of a line between an initial set of sampled points, in this case, voltage values 356, 358, 360 and 362. Dotted-line 316 may be considered a superposition of rising edges 324, 326 and 328, wherein falling edges 320 and 322 are not included. The processing for generating waveform 310 is performed by compressive reconstructor 108.

For a compressive reconstructor to reconstruct a signal, the detected voltages must be associated with the appropriate sampled times. This can be accomplished by associating increasing sampled voltages, e.g., voltage values 360, 362, 366, and 368, with increasing sampled times, respectively, e.g., $t_5$, $t_6$, $t_{10}$, and $t_{11}$.

As seen in the figure, voltage values 360 and 362, increase with respective, increasing sampled times and voltage values 366 and 368, additionally increase with respective, increasing sampled times. In this example, voltage value 360<voltage value 362, voltage value 366<voltage value 368 and voltage value 368<voltage value 360.

When considering voltage values 360, 362, 366, and 368, compressive reconstructor may incorrectly associate voltage values 360, 362, 366, and 368 with random sampling times $t_5$, $t_6$, $t_{10}$, and $t_{11}$. If a compressing reconstructor is presuming an a rising edge, then the sampled voltages would increase. In such a case, a compressing reconstructor mar arrange voltage values 360, 362, 366, and 368 in a sampled order of voltage values 366, 368, 360 and 362. By arranging the samples in increasing order, the compressive reconstructor may incorrectly determine that the sampled signal would correspond to: voltage value 366 sampled at time $t_5$; voltage value 368 sampled at time $t_6$; voltage value 360 sampled at time $t_{10}$; and voltage value 362 sampled at time $t_{11}$. Clearly, this is not the order of the sampled voltage values.

To avoid the above discussed issue, a constantly increasing waveform is simulated, wherein sampled voltage values are mapped to the constantly increasing waveform. In this example, dotted-line 316 is the simulated constantly increasing waveform, wherein voltage values 366, 368, 370 and 372 are mapped thereto, as voltage values 374, 376 and 378 (the mapped voltage value corresponding to voltage value 372 is not shown). With the mapping of voltage values 366, 368 and 370 to voltage values 374, 376 and 378, respectively, the set of voltage values 356, 358, 360, 362, 374, 376 and 378 continuously increase. Accordingly, the increasing sampling times $t_2$, $t_3$, $t_5$, $t_6$, $t_{10}$, $t_{11}$ and $t_{13}$ may be correctly mapped to the correct voltage values 356, 358, 360, 362, 374, 376 and 378, respectively.

It should be noted that voltage values 374, 376 and 378 are not the sampled voltage values. As seen in FIG. 3, voltage values 374, 376 and 378 are much higher that the actual sampled voltage values, voltage values 366, 368 and 370, respectively. Now that the correct sampling times have been associated with voltage values 356, 358, 360, 362, 374, 376 and 378, the sampling times for voltage values 374, 376 and 378 are then associated with actually sampled voltage values 366, 368 and 370, respectively.

In other words, in accordance with an aspect of the present invention, an initial set if increasing sampled voltage values are used to construct a linearly increasing waveform. Subsequently sampled voltage values are then mapped to the linearly increasing waveform. Once all the sampled values are mapped to the waveform. The increasing sample times are associated with respective increasing mapped voltage values. Once the mapped voltage values are associated with the correct sampling times, the sampling times are associated with the correct original voltage values.

There is another issue that needs to be addressed—sampled voltage values on a falling edge of a signal. For example, sampled voltage value 364 is sampled on falling edge 320 of waveform 310. These such sampled voltages are ignored.

The process for generating waveform 310 in accordance with aspects of the present invention involves recording the sampled voltage values $\{y_i\}$ and the corresponding counter values associated with waveform 310 $\{N_i\}$. Furthermore, the process involves determining the maximum voltage achieved for waveform 310, $y_{max}=\max\{y_i\}$. Furthermore, the process involves estimating the slope, noted as m, of the upward ramp for waveform 310 using the calculated ramp time and the maximum voltage recorded, $m=t_{ramp}/y_{max}$. Furthermore, negative-transitioning samples are discarded (e.g. voltage value 664). Furthermore, compute estimated times based on Equation (1) shown below:

$$t_i = t_{i-1} + m(y_i - y_{i-1} + (N_i - N_{i-1})*y_{max}) + (N_i - N_{i-1})*t_{fall} \quad (1)$$

The variable $t_{fall}$ for Equation (1) represents the fall time for waveform 610. As an example, $t_{fall}$ may be represented by the difference in time between time $t_9$ and time $t_{10}$.

Figure 4:
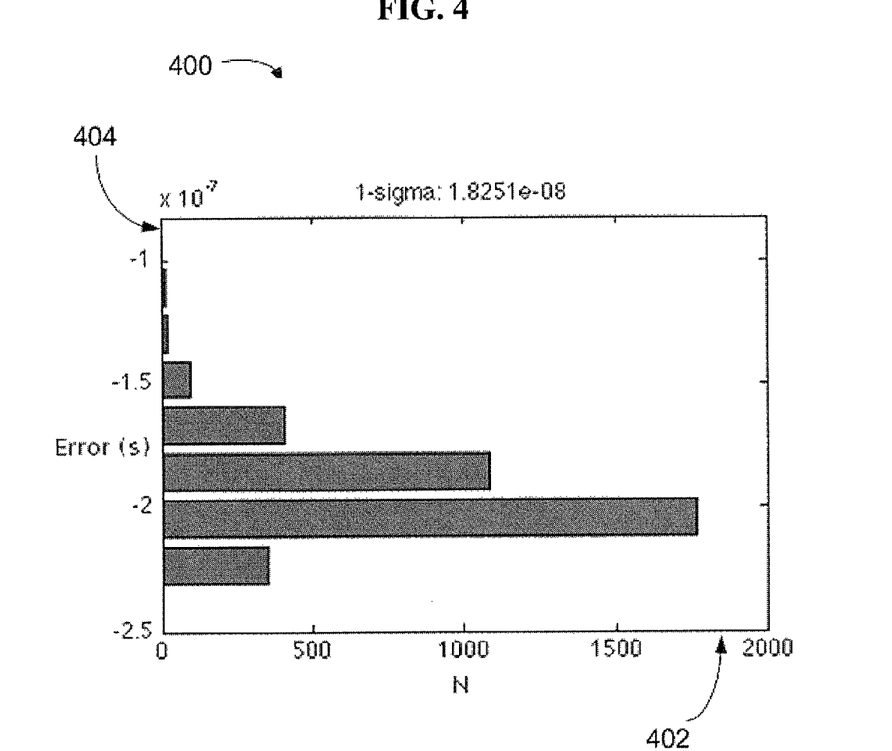
FIG. 4 illustrates an example histogram for measured time estimation error associated with the time estimation as performed per Equation (1), in accordance with an aspect of the present invention.

FIG. 4 illustrates an example histogram 400 for measured time estimation error associated with the time estimation as performed per Equation (1), in accordance with an aspect of the present invention.

Histogram 400 represents the error between estimated time per Equation (1) and the actual measured time for the example compressive sensor system as described with reference to FIG. 2. Histogram 400 includes an x-axis 402 with units for number of samples and a y-axis 404 representing error with units of seconds×$10^{-7}$.

The wider and more dispersed histogram 400, the greater the error associated with estimating the time per Equation (1). Alternatively, the narrower and less dispersed histogram 400, the less the error associated with estimating the time per Equation (1).

Histogram 400 initiates at y-axis 404 bin sample value of approximately 10 samples at a time of approximately 1.2×$10^{-7}$ seconds. Histogram 400 presents y-axis 404 bin sample value of approximately 30 sample at a time of approximately 1.3×$10^{-7}$ seconds. Histogram 400 presents y-axis 404 bin sample value of approximately 125 samples at a time of approximately 1.5×$10^{-7}$ seconds. Histogram 400 presents y-axis 404 bin sample value of approximately 400 sample at a time of approximately 1.6×$10^{-7}$ seconds. Histogram 400 presents y-axis 404 bin sample value of approximately 1100 sample at a time of approximately 1.8×$10^{-7}$ seconds. Histogram 400 presents y-axis 404 bin sample value of approximately 1800 sample at a time of approximately 2×$10^{-7}$ seconds. Histogram 400 presents y-axis 404 bin sample value of approximately 350 sample at a time of approximately 2.2×$10^{-7}$ seconds.

The statistical one sigma ($\sigma$) standard deviation for histogram 400 is presented as 18.251 ns, representing a maximum frequency which can be reconstructed for this example of approximately 27 MHz as determined by Equation (2) shown below:

$$f_{max}=0.5/\sigma \quad (2)$$

The value $f_{max}$ represents the maximum frequency that can be reconstructed based upon the one sigma ($\sigma$) standard deviation of the estimated time error. Attempting to reconstruct signals with a frequency component above $f_{max}$ may not perform well.

Figure 5:
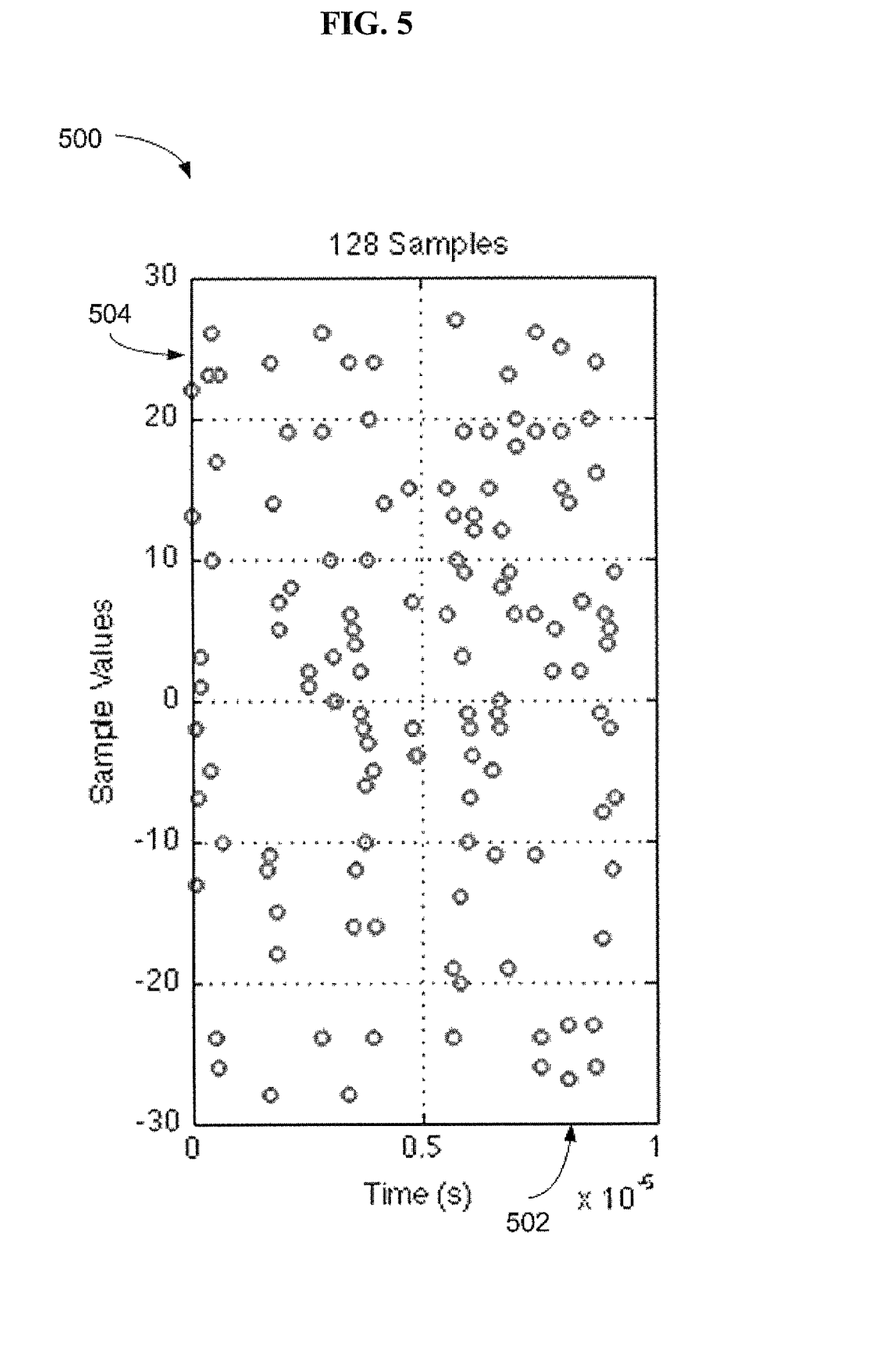
FIG. 5 illustrates an example graph representing sample values versus time, in accordance with an aspect of the present invention.

FIG. 5 illustrates an example graph 500 representing sample values versus time, in accordance with an aspect of the present invention.

Graph 500 includes an x-axis 502 with units of seconds×$10^{-5}$ and a y-axis 504 with units representing a proportional voltage.

The values for y-axis 504 represent a proportional voltage as depicted by digital signal 116 as described with reference to FIGS. 1-2. The time values for x-axis 502 represent the estimated time as calculated by compressive reconstructor as described with reference to FIGS. 1-2 and per the previously discussed Equation (1). Two frequency components, 5.5 MHz and 7 MHz, are contained within the presented 128 samples.

Figure 6:
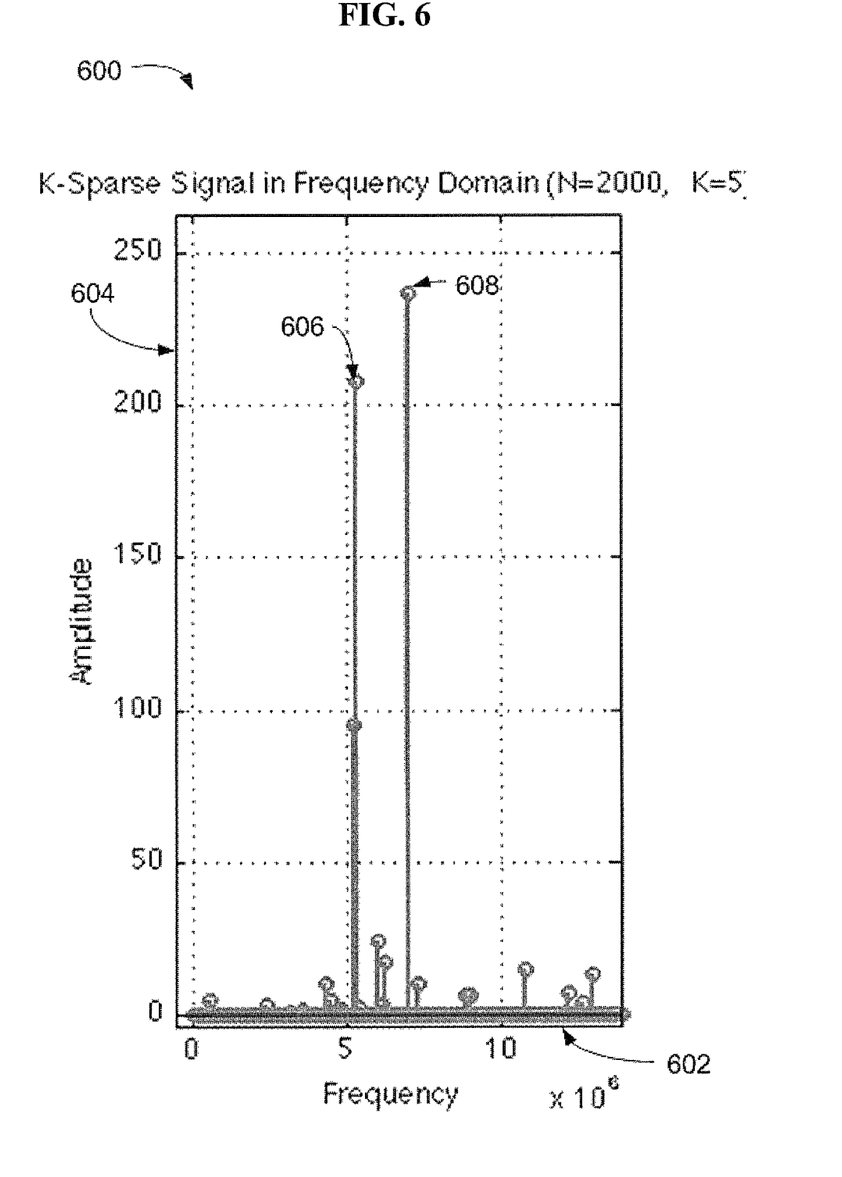
FIG. 6 illustrates an example graph representing the reconstruction of the data of FIG. 5, in accordance with an aspect of the present invention.

FIG. 6 illustrates an example graph 600 representing the reconstruction of the data as discussed with reference to FIG. 5, in accordance with an aspect of the present invention.

Graph 600 includes an x-axis 602 with units of Hertz×$10^6$ and a y-axis 604 with units of Volts.

A frequency component 606 is presented with an x-axis frequency of 5.5 MHz and a y-axis voltage of approximately 210 Volts. A frequency component 608 is presented with an x-axis frequency of 7 MHz and a y-axis voltage of approximately 240 Volts.

Graph 600 illustrates successful reconstruction of the 5.5 MHz signal and 7 MHz signal associated with the data presented in FIG. 5.

For a conventional reconstruction implementation, reconstruction of a 7 MHz signal would require a sample frequency of at least twice or 14 MHz for success. For this example, the 7 MHz signal was reconstructed using a random sample clock with a frequency of 1 MHz, significantly less than the minimum 14 MHz conventional sample clock.

Figure 7:
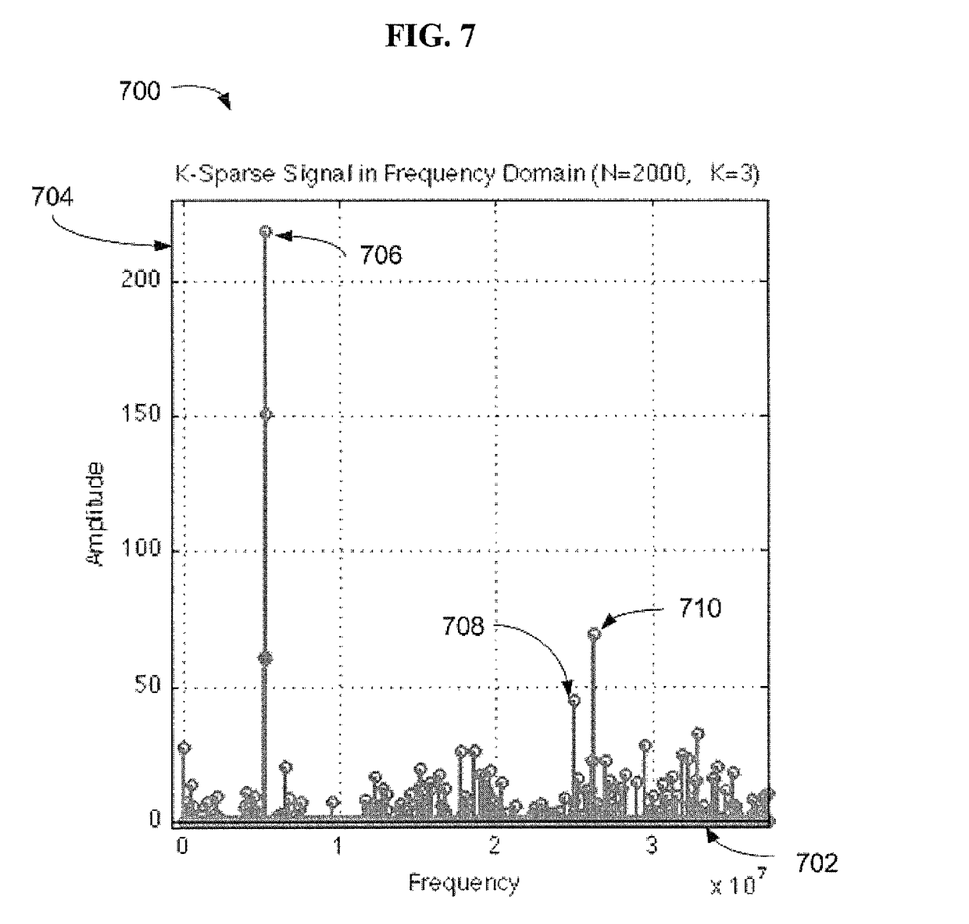
FIG. 7 illustrates another example graph representing reconstruction of data, in accordance with an aspect of the present invention.

FIG. 7 illustrates an example graph 700 representing the reconstruction of the data, in accordance with an aspect of the present invention.

Graph 700 includes an x-axis 702 with units of Hertz×$10^7$ and a y-axis 704 with units of Volts.

The data for reconstruction included a 5 MHz signal and a 25 MHz signal, where the 25 MHz signal was close the $f_{max}$ of 27 MHz as calculated by Equation (2). A frequency component 706 is presented with an x-axis frequency of 5 MHz and a y-axis voltage of approximately 230 Volts. A frequency component 708 is presented with an x-axis frequency of 25 MHz and a y-axis voltage of approximately 49 Volts. A frequency component 710 is presented with an x-axis frequency of approximately 26 MHz and a y-axis voltage of approximately 70 Volts.

As may be observed, the 5 MHz signal was successfully reconstructed. The 25 MHz signal was somewhat reconstructed, although with a lower voltage and with an unwanted frequency component at approximately 26 MHz. The poor performance for reconstructing the 25 MHz signal is due to the limitations for the timing estimation as described with reference to Equation (2), as the 25 MHz signal was close to the $f_{max}$ of 27 MHz.

Figure 8:
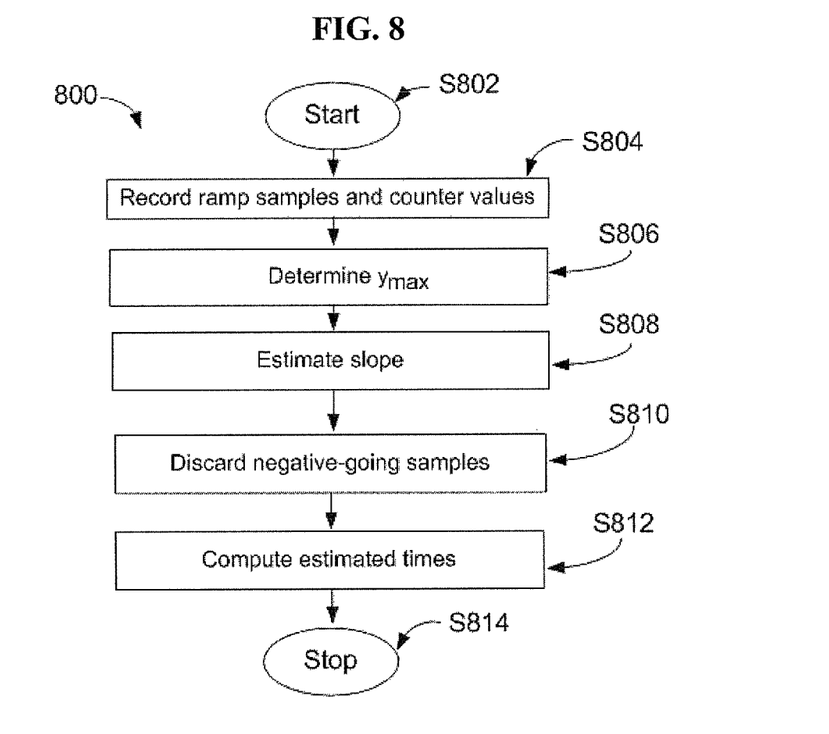
FIG. 8 illustrates an example method for performing time estimation, in accordance with an aspect of the present invention.

FIG. 8 illustrates an example method 800 for performing time estimation, in accordance with an aspect of the present invention.

Method 800 presents processing as discussed with reference to Equation (1).

Method 800 starts (S802) with storage of ramp samples, $\{y_i\}$, and counter values $\{N_i\}$ (S804). For example, the ramp values associated with random timing signal 118 as described with reference to FIGS. 1-2 and the counter values associated with counter signal 120 as described with reference to FIGS. 1-2 are stored.

The maximum value, $y_{max}$, for the stored ramp samples, $\{y_i\}$, is then determined (S806). For example, the maximum ramp value for rising edge 324 of waveform 310 for a voltage value 356, voltage value 358, voltage value 360 and voltage value 362, as described with reference to FIG. 3 would be determined as voltage value 362.

The slope, m, of the ramp would then be estimated as m=$t_{ramp}/y_{max}$ (S808). The estimated ramp time, $t_{ramp}$, associated with ramp signal 242 as digitized by sampling ADC 205, as calculated by compressive reconstructor 108 and as described with reference to FIGS. 1-2, is divided by the previously determined $y_{max}$.

Negative-going samples of the stored ramp samples, $\{y_i\}$, are discarded (S810). As an example, voltage value 364 of waveform 310 as described with reference to FIG. 3 is discarded, as voltage value 364 occurs when the ramp signal is decreasing.

Estimated times are then calculated (S812). For example, the calculation as described with reference to Equation (1) is performed.

Method 800 then stops (S814).

A compressive sensor system in accordance with the present invention uses a physical random interval generator that enables reconstruction of signals using a clock signal with a lower frequency component than contained within the signals to be reconstructed.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system for use with an input signal and a clock signal, said system comprising:
   a physical random interval generator operable to generate a random output signal;
   a sampling analog-to-digital converter operable to output a sampled output signal based on the input signal and the random output signal;
   a timing signal generator operable to output a timing signal based on the clock signal and the random output signal;
   a reconstructor operable to reconstruct an information signal based on the sampled output signal and the timing signal; and
   wherein said physical random interval generator comprises a single-photon emitting light source.

2. The system of claim 1,
   wherein said single-photon emitting light source comprises a diode laser,
   wherein said physical random interval generator further comprises an attenuator and a Geiger-mode avalanche photodiode,
   wherein said attenuator is disposed between said diode laser and said Geiger-mode avalanche photodiode, and
   wherein photons transmitted through said attenuator to said Geiger-mode avalanche photodiode have exponentially distributed time intervals.

3. The system of claim 2, wherein said sampling analog-to-digital converter comprises a flash analog-to-digital converter.

4. The system of claim 3, wherein said timing signal generator comprises a ramp generator and a flash analog-to-digital converter.

5. The system of claim 1, wherein said sampling analog-to-digital converter comprises a flash analog-to-digital converter.

6. The system of claim 5, wherein said timing signal generator comprises a ramp generator and a flash analog-to-digital converter.

7. The system of claim 1, wherein said timing signal generator comprises a ramp generator and a flash analog-to-digital converter.

8. The system of claim 1,
   wherein the input signal comprises a first frequency, and
   wherein the clock signal comprises a second frequency lower than the first frequency.

9. The system of claim 1, wherein the input signal comprises an RF signal.

10. A method of using an input signal and a clock signal, said method comprising:
    generating, via a physical random interval generator, a random output signal;
    outputting, via a sampling analog-to-digital converter, a sampled output signal based on the input signal and the random output signal;
    outputting, via a timing signal generator, a timing signal based on the clock signal and the random output signal;
    reconstructing, via a reconstructor, an information signal based on the sampled output signal and the timing signal; and
    wherein said generating, via a physical random interval generator, a random output signal comprises generating the random output signal via a single-photon emitting light source.

11. The method of claim 10,
    wherein said generating the random output signal via a single-photon emitting light source comprises generating the random output signal via a diode laser,
    wherein said generating, via a physical random interval generator, a random output signal further comprises generating the random output signal via an attenuator and a Geiger-mode avalanche photodiode,
    wherein the attenuator is disposed between the diode laser and the Geiger-mode avalanche photodiode, and
    wherein photons transmitted through the attenuator to the Geiger-mode avalanche photodiode have exponentially distributed time intervals.

12. The method of claim 11, wherein said outputting, via a sampling analog-to-digital converter, a sampled output signal based on the input signal and the random output signal comprises sampling via a flash analog-to-digital converter.

13. The method of claim 12, wherein said outputting, via a timing signal generator, a timing signal based on the clock signal and the random output signal comprises outputting, via a ramp generator and a flash analog-to-digital converter.

14. The method of claim 10, wherein said outputting, via a sampling analog-to-digital converter, a sampled output signal based on the input signal and the random output signal comprises sampling via a flash analog-to-digital converter.

15. The method of claim 14, wherein said outputting, via a timing signal generator, a timing signal based on the clock signal and the random output signal comprises outputting, via a ramp generator and a flash analog-to-digital converter.

16. The method of claim 10, wherein said outputting, via a timing signal generator, a timing signal based on the clock signal and the random output signal comprises outputting, via a ramp generator and a flash analog-to-digital converter.

17. The method of claim 10,
    wherein the input signal comprises a first frequency, and
    wherein the clock signal comprises a second frequency lower than the first frequency.

18. The method of claim 10, wherein the input signal comprises an RF signal.

* * * * *